(12) United States Patent
Kim et al.

(10) Patent No.: US 11,723,238 B2
(45) Date of Patent: Aug. 8, 2023

(54) DISPLAY DEVICE INCLUDING A MAXIMIZED IMAGE OUTPUT AREA

(71) Applicant: Samsung Display Co., Ltd., Yongin-si (KR)

(72) Inventors: Gunshik Kim, Yongin-si (KR); Jonghyun Choi, Yongin-si (KR); Sanghoon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 299 days.

(21) Appl. No.: 16/867,006

(22) Filed: May 5, 2020

(65) Prior Publication Data

US 2021/0020716 A1    Jan. 21, 2021

(30) Foreign Application Priority Data

Jul. 17, 2019    (KR) .......................... 10-2019-0086636

(51) Int. Cl.
| | |
|---|---|
| *H10K 59/123* | (2023.01) |
| *H10K 59/131* | (2023.01) |
| *H10K 59/121* | (2023.01) |
| *H10K 77/10* | (2023.01) |
| *H10K 102/00* | (2023.01) |

(52) U.S. Cl.
CPC ....... *H10K 59/123* (2023.02); *H10K 59/1213* (2023.02); *H10K 59/131* (2023.02); *H10K 77/111* (2023.02); *H10K 2102/311* (2023.02)

(58) Field of Classification Search
CPC ............. H01L 27/3248; H01L 27/3262; H01L 27/3276; H01L 51/0097; H01L 2251/5338

USPC ........................................................ 257/40
See application file for complete search history.

(56) References Cited

U.S. PATENT DOCUMENTS

| | | |
|---|---|---|
| 8,895,970 B2 | 11/2014 | Kim et al. |
| 9,882,152 B2 | 1/2018 | Namkung et al. |
| 9,905,798 B2 | 2/2018 | Jang |
| 9,959,813 B2 | 5/2018 | An et al. |
| 10,319,951 B2 | 6/2019 | Lee |
| 2015/0102298 A1* | 4/2015 | Namkung ........... H01L 51/0097 438/34 |
| 2015/0340648 A1* | 11/2015 | Jang ................... H01L 27/3276 438/23 |

(Continued)

FOREIGN PATENT DOCUMENTS

| | | |
|---|---|---|
| KR | 10-2015-0043647 | 4/2015 |
| KR | 10-2015-0135724 | 12/2015 |
| KR | 10-2016-0092154 | 8/2016 |

(Continued)

*Primary Examiner* — Xia L Cross
(74) *Attorney, Agent, or Firm* — Kile Park Reed & Houtteman PLLC

(57) ABSTRACT

A display device may include a substrate including a first area and a second area surrounding the first area, and pixel circuits disposed on the substrate. The pixel circuits may include a first pixel circuit disposed in the first area and a second pixel circuit disposed in the first area. The display device may include display elements disposed on the substrate. The display elements may include a first display element that may be disposed in the first area and electrically connected to the first pixel circuit and a second display element that may be disposed in the second area and electrically connected to the second pixel circuit. Various embodiments are disclosed.

13 Claims, 14 Drawing Sheets

(56) References Cited

U.S. PATENT DOCUMENTS

2018/0047799 A1* 2/2018 Lim ................ H01L 27/3248
2018/0151850 A1* 5/2018 Lee ................ H01L 27/3206

FOREIGN PATENT DOCUMENTS

| KR | 10-2018-0061850 | 6/2018 |
| KR | 10-1938760 | 1/2019 |
| KR | 10-2019-0047565 | 5/2019 |

* cited by examiner

DISPLAY DEVICE INCLUDING A MAXIMIZED IMAGE OUTPUT AREA

CROSS-REFERENCE TO RELATED APPLICATION

This application claims priority to and benefits of Korean Patent Application No. 10-2019-0086636 under 35 U.S.C. § 119, filed in the Korean Intellectual Property Office on Jul. 17, 2019, the entire contents of which are incorporated herein reference.

BACKGROUND

1. Technical Field

One or more embodiments relate to a display device in which an output area of an image may be maximized.

2. Description of Related Art

A display device, which is an apparatus for outputting images, may be widely used in various fields. Due to its small thickness and light weight, the display device is being even more widely used.

A display device may include an area that cannot output an image on a screen due to design reasons, that is, a dead space. For example, the display device may include a dead space around an area in which circuit components for driving the display are arranged or an area in which electronic elements such as a sensor are arranged.

It is to be understood that this background of the technology section is, in part, intended to provide useful background for understanding the technology. However, this background of the technology section (and other sections) may also include ideas, concepts, or recognitions that were not part of what was known or appreciated by those skilled in the pertinent art prior to a corresponding effective filing date of the subject matter disclosed herein.

SUMMARY

For aesthetic impression and convenience of use, it may be desired to maximize an area of a screen in which an image may be output and reduce a dead space of a display device. One or more embodiments may include a display device in which display elements and circuit elements of a pixel may be arranged in different areas to maximize an output area of an image.

Additional aspects will be set forth in part in the description which follows and, in part, will be apparent from the description, or may be learned by practice of the embodiments of the disclosure.

According to one or more embodiments, a display device may include a substrate including a first area and a second area surrounding the first area, and pixel circuits disposed on the substrate, and the pixel circuits including a first pixel circuit disposed in the first area and a second pixel circuit disposed in the first area. The display device may include display elements disposed on the substrate, the display elements including a first display element that may be disposed in the first area and electrically connected to the first pixel circuit and a second display element that may be disposed in the second area and electrically connected to the second pixel circuit.

The display elements may each include a pixel electrode, an opposite electrode disposed on the pixel electrode, and an intermediate layer between the pixel electrode and the opposite electrode. The pixel electrode of the second display element may extend from the second area to the first area and be electrically connected to the second pixel circuit in the first area.

The display device may further include a contact metal layer between the pixel circuits and the display elements, wherein the contact metal layer may extend from the first area to the second area and electrically connect the second pixel circuit disposed in the first area and the second display element disposed in the second area.

A distance between the first pixel circuit and the second pixel circuit may be less than a distance between the first display element and the second display element.

A number of the pixel circuits disposed in the first area may be greater than a number of display elements disposed in the first area.

A number of the pixel circuits disposed in the first area may correspond to a number of the display elements disposed in the first area or the second area.

The pixel circuits may each include a thin film transistor including a semiconductor layer, a gate electrode overlapping the semiconductor layer, and an electrode layer connected to the semiconductor layer. The pixel electrode of the second display element may be electrically connected to the electrode layer of the second pixel circuit.

A number of the pixel circuits per unit area may be greater than a number of the display elements per unit area.

The second display element may be disposed to overlap at least one of a driving circuit and a connection line which may be disposed on the substrate in the second area.

The first pixel circuit and the first display element may be disposed to overlap each other on the substrate.

According to one or more embodiments, a display device may include a substrate including a first area and a second area, and display elements disposed on the substrate and located in the first area, the display elements including a first display element and a second display element. The display device may include pixel circuits disposed on the substrate and located in the second area, the pixel circuits including a first pixel circuit that may be electrically connected to the first display element and a second pixel circuit that may be electrically connected to the second display element.

The first display element and the second display element may each include a pixel electrode, an opposite electrode disposed on the pixel electrode to overlap the pixel electrode, and an intermediate layer between the pixel electrode and the opposite electrode. At least one of the pixel electrode of the first display element and the pixel electrode of the second pixel electrode may extend from the first area to the second area to be connected to any one of the pixel circuits.

The display device may further include a contact metal layer between the pixel circuits and the display elements. The contact metal layer may extend from the first area to the second area and include at least one of a first contact metal layer connecting the first pixel circuit to the first display element and a second contact metal layer connecting the second display circuit to the second display element.

The display elements may each include a pixel electrode, an opposite electrode arranged on the pixel electrode, wherein the opposite electrode and the pixel electrode overlap each other, and an intermediate layer between the pixel electrode and the opposite electrode. At least one of the first contact metal layer and the second contact metal layer may electrically connect an electrode layer included in any one of the pixel circuits to a pixel electrode included in any one of the display elements.

A number of the pixel circuits per unit area may be greater than a number of the display elements per unit area.

A number of the display elements disposed in the first area may correspond to a number of the pixel circuits disposed in the second area.

The first area may include a bending area.

According to one or more embodiments, a display device may include a substrate including a first area, a second area that may be surrounded by the first area, and an opening area surrounded by the second area. This display device may include pixel circuits disposed on the substrate and including a first pixel circuit disposed in the first area and a second pixel circuit disposed in the first area, and display elements disposed on the substrate. The display elements may include a first display element that may be electrically connected to the first pixel circuit and disposed in the first area, and a second display element that may be electrically connected to the second pixel circuit and disposed in the second area.

The second display element may be electrically connected to the second pixel circuit via one of a pixel electrode included in the second display element and extending from the second area to the first area and a contact metal layer between the pixel circuits and the display elements and extending from the first area of the second area.

A distance between the first pixel circuit and the second pixel circuit may be less than a distance between the display element and the second display element.

According to one or more embodiments, a display device may include a substrate that may include a first area corresponding to a display area of the display device and a second area corresponding to a non-display area of the display device. The display device may include pixel circuits disposed on the substrate and in the first area, and display elements disposed on the substrate in the first area and the second area. At least one of the pixel circuits may be electronically connected with at least one of the display elements disposed in the second area.

The display element may include at least one display element disposed at a boundary portion between the first area and the second area. At least another one of the pixel circuits may be electrically connected with the at least one display element disposed at the boundary portion.

Aspects, features, and advantages in addition to the above description will be clearly understood from drawings, claims, and detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENT

Figure 1:
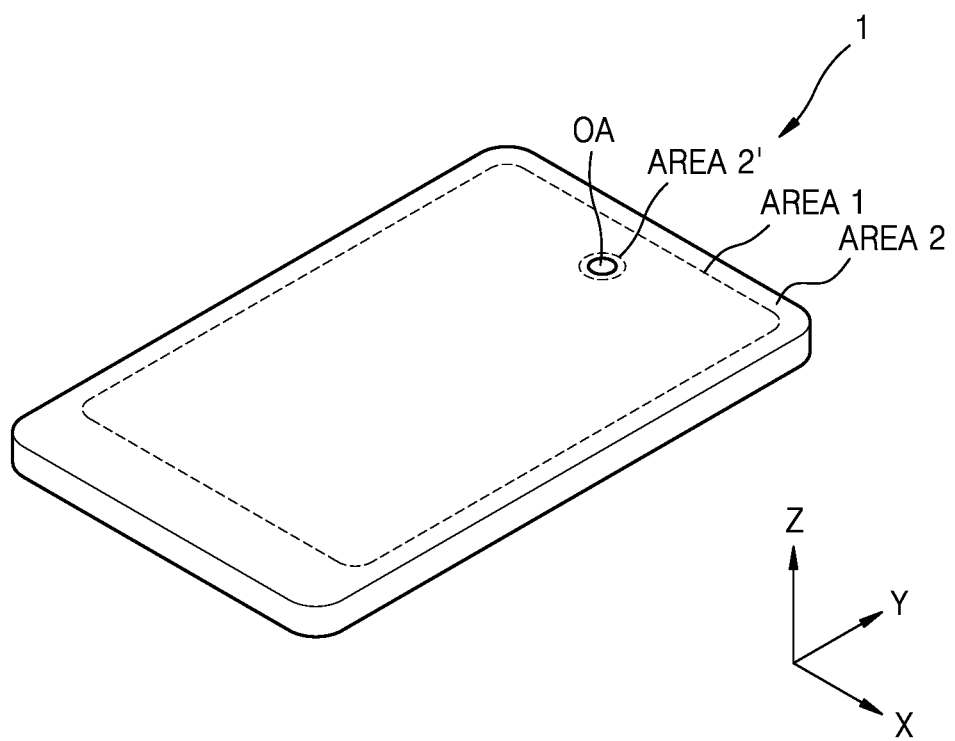
FIG. 1 is a schematic perspective view showing an electronic device according to an embodiment.

Advantages, features, and methods of achieving the advantages and features will be described more fully with reference to the accompanying drawings, in which embodiments are shown in detail. However, the disclosure may be embodied in many different forms and should not be construed as limited to the embodiments set forth herein.

Like reference numerals refer to like elements throughout. Redundant descriptions may be omitted, as may be descriptions of aspects known to one of ordinary skill in the art.

It will be understood that although terms such as "first," "second," or the like may be used herein to describe various components, these components are not limited by these terms. Rather, the terms are only used to distinguish one component from one another.

As used herein, the singular forms "a," "an," and "the" are intended to include the plural forms as well, unless the context clearly indicates otherwise.

It will be further understood that the terms "comprises," "comprising," "includes," "including", "have", "having", or the like used herein specify the presence of stated features or components, but do not preclude the presence or addition of one or more other features or components.

In embodiments, it will be understood that when a layer, an area, or a component is referred to as being "on," "above," "below," or the like with respect to another layer, area, or component, the layer, area, or component may be directly on (above, below, or the like) the other layer, area, or component, or an intervening layer, region, or component may be present therebetween.

Sizes of components in the drawings may be exaggerated or reduced for convenience of explanation. In other words, since sizes and thicknesses of components in the drawings may be arbitrarily illustrated for convenience of explanation, the disclosure is not limited thereto.

When a certain embodiment may be differently implemented, a specific process order may be performed differently from the described order. For example, two consecutively described processes may be performed substantially at the same time or performed in an order opposite to the described order.

In following embodiments, when a layer, region, or component is "connected" to another layer, region, or component, the layer, region, or component may be directly connected to the other layer, region, or component, and may be indirectly connected to the other layer, region, or component with another layer, region, or component therebetween. For example, in the specification, when a layer, region, or component is "electrically connected to" another layer, region, or component, the layer, region, or component may be electrically connected in a direct manner to the other layer, region, or component, and electrically connected in an indirect manner to the other layer, region, or component with another layer, region, or component therebetween.

In embodiments, x axis, y axis, and z axis are not limited to three axes on a rectangular coordinate system and may be interpreted as a wider meaning. For example, the x axis, y axis, and z axis may be orthogonal to one another but may also indicate different directions that are not orthogonal to one another.

In the specification, A "and/or" B indicates A, B, or A and B. The terms "and" and "or" may be used in the conjunctive or disjunctive sense and may be understood to be equivalent to "and/or". In the specification and the claims, the phrase "at least one of" is intended to include the meaning of "at least one selected from the group of" for the purpose of its meaning and interpretation. For example, "at least one of A and B" may be understood to mean "only A, only B, or both A and B."

The terms "overlap," "overlapped," "overlapping", or the like mean that a first object may be above or below or to a side of a second object, and vice versa. The term "overlap" (and the like) may include layer, stack, face or facing, extending over, covering or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic perspective view showing a display device 1 according to an embodiment.

Referring to FIG. 1, the display device 1 may output an image to outside through a front face thereof. The display device 1 may also output an image through the front face and at least a portion of a side face thereof. For example, the display device 1 may output an image to the outside through pixels. Each pixel may include a pixel circuit including a driving thin-film transistor and a display element (for example, an organic light-emitting diode) that may be electrically connected to the pixel circuit. For example, the display device 1 may emit light through the display element based on an electrical signal that may be applied to the pixel circuit.

The display device 1 may include a first area AREA1, and a second area AREA2.

The first area AREA1 may be an area in which pixel circuits for pixels are arranged. The second area AREA2 may include an area which partially or entirely surrounds the first area AREA1.

The display device 1 may include another second area AREA2' and an opening area OA.

The opening area OA may correspond to a position at which an electronic element outputting or inputting light or sound may be arranged. The opening area OA may include a transmission area, through which at least one of light or sound may be output from the electronic element to outside or input from outside to the electronic element.

The another second area AREA2' may be located inside the first area AREA1 and surround the opening area OA. In other words, the another second area AREA2' may be surrounded by the first area AREA1, and the opening area OA may be surrounded by the another second area AREA2'.

FIG. 1 shows that the opening area OA may be arranged at a center of an upper side of a surface of the display device 1, but the opening area OA may be arranged in various numbers and forms in various positions of the display device 1. Unlike what is shown in FIG. 1, in some embodiments, the display device 1 may not include the opening area OA and the another second area AREA2'.

Hereinafter, the display device 1 may be described as an example of an organic light-emitting device, but the display device 1 according to various embodiments may include an inorganic light-emitting display and a quantum dot light-emitting display, etc.

Figure 2:
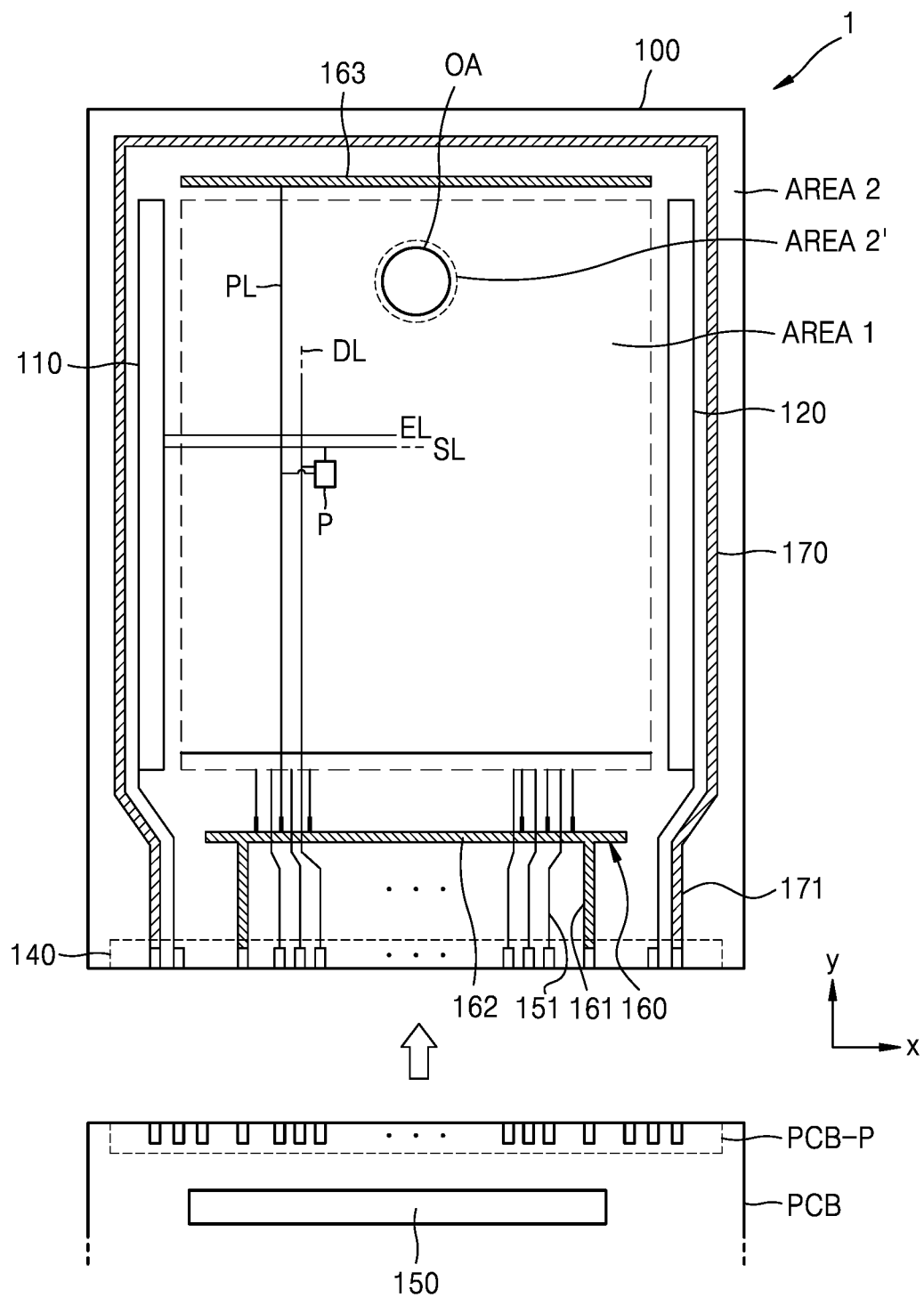
FIG. 2 is a schematic top-plan view of a display device according to an embodiment.

FIG. 2 is a schematic top-plan view of the display device 1 according to an embodiment.

Referring to FIG. 2, the display device 1 may include multiple pixels P. The pixels P may emit, for example, red, green, blue, or white light through a pixel circuit and a display element that may be electrically connected to the pixel circuit.

The pixels P may be electrically connected to driving circuits arranged in the second area AREA2. For example, at least one of a first scanning driving circuit 110, a second scanning driving circuit 120, a terminal 140, a first power supply line 160, and a second power supply line 170 may be arranged in the second area AREA2.

The first scanning driving circuit 110 may provide a scanning signal to each pixel P through a scanning line SL. The first scanning driving circuit 110 may provide an emission control signal to each pixel P through an emission control line EL.

The second scanning driving circuit 120 may be arranged in parallel to the first scanning driving circuit 110. The first area AREA1 may be disposed between the first scanning driving circuit 110 and the second scanning driving circuit 120. For example, some of the pixels P arranged in the first area AREA1 may be electrically connected to the first scanning driving circuit 110, and others of the pixels P arranged in the first area AREA1 may be connected to the second scanning driving circuit 120.

According to another embodiment, the display device 1 may not include the first scanning driving circuit 110 or the second scanning driving circuit 120, and the pixels P may be connected to one scanning driving circuit provided in the display device 1.

The terminal 140 may be arranged at a side of a substrate 100. The terminal 140 may be exposed by not being covered by an insulating layer and be electrically connected to a printed circuit board PCB.

A second terminal PCB-P of the printed circuit board PCB may be electrically connected to the terminal 140 of the display device 1. The printed circuit board PCB may deliver a signal or power from outside to the display device 1. For example, the printed circuit board PCB may deliver a control signal, which may be received from a processor (not shown), to the first scanning driving circuit 110 and/or the second scanning driving circuit 120. The printed circuit board PCB may deliver a first power voltage (ELVDD) (see FIGS. 3 and 4) and a second power voltage (ELVSS) (see FIGS. 3 and 4), which may be received from the processor (not shown), to the first power supply line 160 and the second power supply line 170 through a first connection line 161 and a second connection line 171. For example, the first power voltage may be provided to each pixel P through a driving voltage line PL connected to the first power supply line 160. The second power voltage may be provided to an opposite electrode of each pixel P connected to the second power supply line 170.

A data driving circuit 150 may be electrically connected to the data line DL. The data driving circuit 150 may provide a data signal to the pixel P through a connection line 151 connected to the terminal 140 and the data line DL connected to the connection line 151.

FIG. 2 shows that the data driving circuit 150 may be arranged in the printed circuit board PCB. However, as another embodiment, the data driving circuit 150 may be arranged on the substrate 100 of the display device 1. For example, the data driving circuit 150 may be arranged between the terminal 140 and the first power supply line 160 in the second area AREA2.

The first power supply line 160 may include a first sub line 162 and a second sub line 163 that extend in parallel to each other along an axis (for example, the x direction) having the first area AREA1 therebetween.

The second power supply line 170, which has a loop shape in which a side may be open, may partially surround the first area AREA1.

Lines, for example, the scanning line SL, the emission control line EL, the data line DL, and the driving voltage line PL, may extend from the driving circuits arranged in the second area AREA2 to the first area AREA1 to provide a signal or power to the pixel P. The lines may be disconnected with respect to the opening area OA. In other embodiments, the lines may be arranged to circumvent the opening area OA. For example, lines circumventing the opening area OA may be disposed in the another second area AREA2'.

Figure 3:
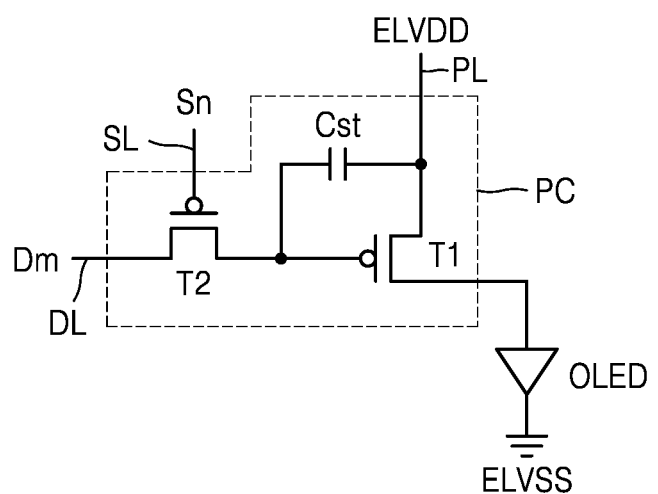
FIG. 3 is an equivalent circuit diagram of a pixel according to an embodiment.

FIG. 3 is an equivalent circuit diagram of the pixel according to an embodiment.

Referring to FIG. 3, the pixel may include a pixel circuit PC, which may be connected to the scanning line SL and the data line DL, and a display element OLED connected to the pixel circuit PC.

The pixel circuit PC may include a driving thin-film transistor T1, a switching thin-film transistor T2, and a storage capacitor Cst.

The switching thin-film transistor T2 may be connected to the scanning line SL and the data line, and in response to the scanning signal Sn input through the scanning line SL, the switching thin-film transistor T2 may deliver the data signal Dm, which may be input through the data line DL, to the driving thin-film transistor T1.

The storage capacitor Cst may be connected to the switching thin-film transistor T2 and the driving voltage line PL and store a voltage corresponding to a difference between a voltage received from the switching thin-film transistor T2 and the first power voltage ELVDD supplied to the driving voltage line PL.

The driving thin-film transistor T1 may be connected to the driving voltage line PL and the storage capacitor Cst and control a driving current flowing from the driving voltage line PL to the display element OLED, in response to a value of the voltage stored in the storage capacitor Cst. In response to the driving current, the display element OLED may emit light that has a luminance to outside.

FIG. 3 shows that the pixel circuit PC includes two thin-film transistors and one storage capacitor, but the disclosure is not limited thereto. For example, the pixel circuit PC may include seven thin-film transistors and one storage capacitor, as shown in FIG. 4.

Figure 4:
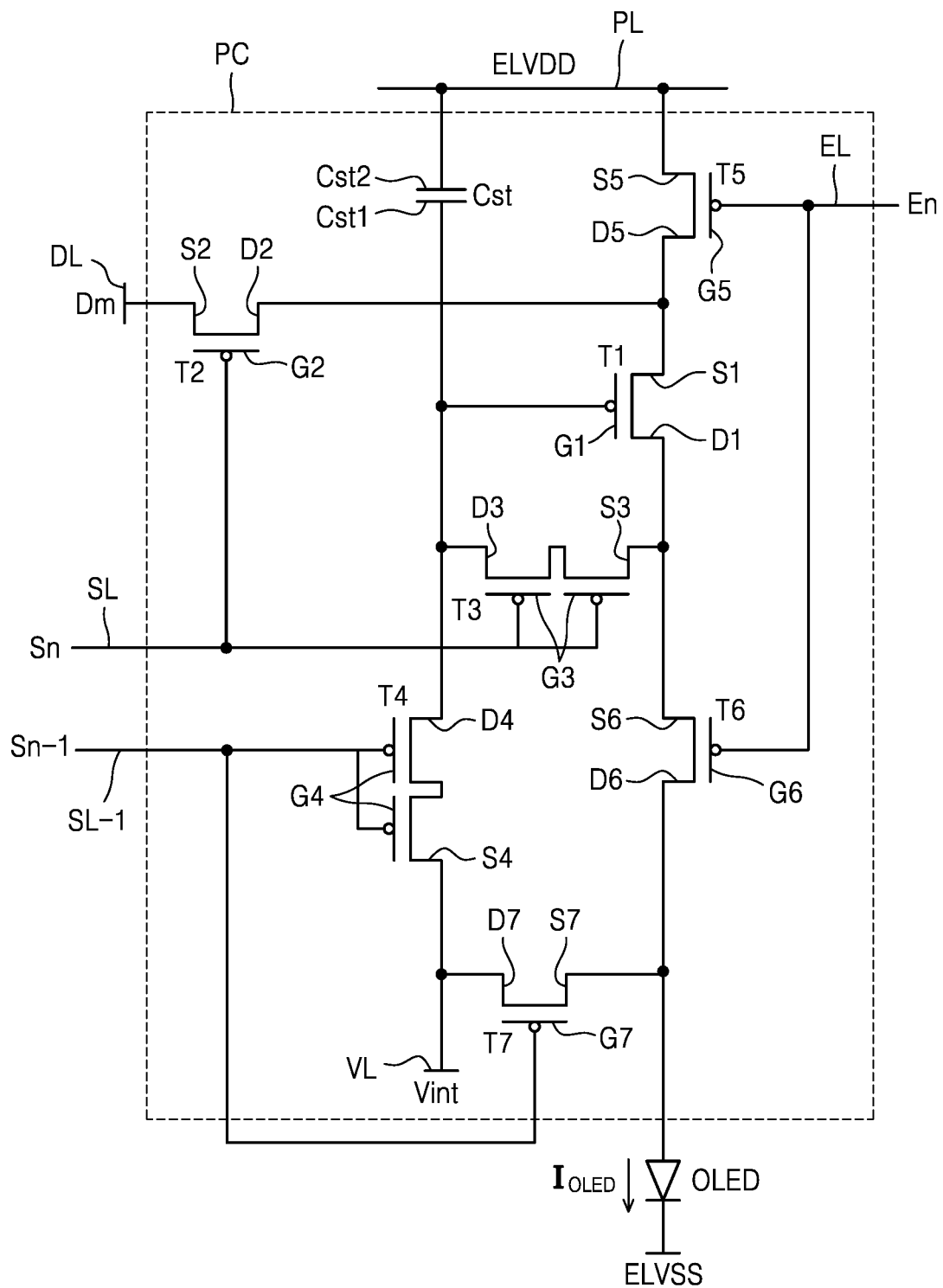
FIG. 4 is an equivalent circuit diagram of a pixel according to an embodiment.

FIG. 4 is an equivalent circuit diagram of a pixel P according to an embodiment.

Referring to FIG. 4, the pixel P may include the pixel circuit PC and a display element OLED connected to the pixel circuit PC.

The pixel circuit PC may include multiple thin-film transistors and a storage capacitor. The thin-film transistors and the storage capacitor may be electrically connected to at least one of signal lines SL, SL-1, EL, DL, an initialization voltage line VL, and the driving voltage line PL.

The thin-film transistors may include at least one of the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines may include the scanning line SL to deliver a scanning signal Sn; a previous scanning line SL-1 to deliver a previous scanning signal Sn-1 to the first initialization thin-film transistor T4 and the second initialization thin-film transistor T7; the emission control line EL to deliver an emission control signal En to the operation control thin-film transistor T5 and the emission control thin-film transistor T6; and the data line DL that intersects with the scanning line SL and delivers the data signal Dm.

The driving voltage line PL may deliver the first power voltage ELVDD to the driving thin-film transistor T1.

The initialization voltage line VL may deliver, to the pixel P, an initialization voltage Vint that initializes the driving thin-film transistor T1 and a pixel electrode.

A driving gate electrode G1 of the driving thin-film transistor T1 may be connected to a first storage capacitive plate Cst1 of the storage capacitor Cst. A driving source electrode S1 of the driving thin-film transistor T1 may be connected to the driving voltage line PL via the operation control thin-film transistor T5. A driving drain electrode D1 of the driving thin-film transistor T1 may be electrically connected to the pixel electrode of the display element OLED via the emission control thin-film transistor T6.

The driving thin-film transistor T1 may receive the data signal Dm in response to a switching operation of the switching thin-film transistor T2 and provide a driving current $I_{OLED}$ the display element OLED.

A switching gate electrode G2 of the switching thin-film transistor T2 may be connected to the scanning line SL. A switching source electrode S2 of the switching thin-film transistor T2 may be connected to the data line DL. A switching drain electrode D2 of the switching thin-film transistor T2 may be connected to the driving source electrode S1 of the driving thin-film transistor T1 and connected to the driving voltage line PL via the operation control thin-film transistor T5.

The switching thin-film transistor T2 may be turned on in response to the scanning signal Sn received through the scanning line SL to perform a switching operation to deliver the data signal Dm, which may be delivered to the data line DL, to the source electrode S1 of the driving thin-film transistor T1.

A compensation gate electrode G3 of the compensation thin-film transistor T3 may be connected to the scanning line SL. A compensation source electrode S3 of the compensation thin-film transistor T3 may be connected to the driving drain electrode D1 of the driving thin-film transistor T1 and may also be connected to the pixel electrode of the display element OLED via the emission control thin-film transistor T6.

A compensation drain electrode D3 of the compensation thin-film transistor T3 may be connected to the first storage capacitive plate Cst1 of the storage capacitor Cst, a first initialization drain electrode D4 of the first initialization thin-film transistor T4, and the driving gate electrode G1 of the driving thin-film transistor T1.

The compensation thin-film transistor T3 may be turned on in response to the scanning signal Sn received through the scanning line SL and electrically connect the driving gate electrode G1 to the driving drain electrode D1 of the driving thin thin-film transistor T1, thereby compensating for the driving thin-film transistor T1.

The first initialization gate electrode G4 of the first initialization thin-film transistor T4 may be connected to the previous scanning line SL-1. A first initialization source electrode S4 of the first initialization thin-film transistor T4 may be connected to a second initialization drain electrode D7 of the second initialization thin-film transistor T7 and the initialization voltage line VL.

The first initialization drain electrode D4 of the first initialization thin-film transistor T4 may be connected to the first storage capacitive plate Cst1 of the storage capacitor Cst, the compensation drain electrode D3 of the compensation thin-film transistor T3, and the driving gate electrode G1 of the driving thin-film transistor T1.

The first initialization thin-film transistor T4 may be turned on in response to the previous scanning signal Sn-1 received through the previous scanning line SL-1 and deliver an initialization voltage Vint to the driving gate electrode G1 of the driving thin-film transistor T1, thereby initializing a voltage of the driving gate electrode G1 of the driving thin-film transistor T1.

An operation control gate electrode G5 of the operation control thin-film transistor T5 may be connected to the emission control line EL. An operation control source electrode S5 of the operation control thin-film transistor T5 may be connected to the driving power voltage line PL. An operation control drain electrode D5 of the operation control thin-film transistor T5 may be connected to the driving source electrode S1 of the driving thin-film transistor T1 and the switching drain electrode D2 of the switching thin-film transistor T2.

An emission control gate electrode G6 of the emission control thin-film transistor T6 may be connected to the emission control line EL. An emission control source electrode S6 of the emission control thin-film transistor T6 may be connected to the driving drain electrode D1 of the driving thin-film transistor T1 and the compensation source electrode S3 of the compensation thin-film transistor T3.

An emission control drain electrode D6 of the emission control thin-film transistor T6 may be electrically connected to a second initialization source electrode S7 of the second initialization thin-film transistor T7 and the pixel electrode of the display element OLED.

The operation control thin-film transistor T5 and the emission control thin-film transistor T6 may be simultaneously turned on in response to the emission control signal En received through the emission control line EL such that the first power voltage ELVDD may be delivered to the display element OLED and the driving current $I_{OLED}$ flows in the display element OLED.

A second initialization gate electrode G7 of the second initialization thin-film transistor T7 may be connected to the previous scanning line SL-1. The second initialization source electrode S7 of the second initialization thin-film transistor T7 may be connected to the emission control drain electrode D6 of the emission control thin-film transistor T6 and the pixel electrode of the display element OLED.

The second initialization drain electrode D7 of the second initialization thin-film transistor T7 may be connected to the first initialization source electrode S4 of the first initialization thin-film transistor T4 and the initialization voltage line VL. The second initialization thin-film transistor T7 may be turned on in response to the previous scanning signal Sn-1 received through the previous scanning line SL-1 to initialize the pixel electrode of the display element OLED.

FIG. 4 shows that the first initialization thin-film transistor T4 and the second initialization thin-film transistor T7 are connected to the previous scanning line SL-1, but the disclosure is not limited thereto. As another embodiment, the first initialization thin-film transistor T4 may be connected to the previous scanning line SL-1 and driven in response to the previous scanning signal Sn-1. The second initialization thin-film transistor T7 may be connected to another signal line (for example, a next scanning line) and driven in response to a signal delivered to the other signal line.

A second storage capacitive plate Cst2 of the storage capacitor Cst may be connected to the driving voltage line PL. The opposite electrode of the display element OLED may be connected to the second power voltage ELVSS that may be a common voltage. Accordingly, the display element OLED may receive the driving current $I_{OLED}$ from the driving thin-film transistor T1 and emit light, thereby displaying an image.

FIG. 4 shows that the compensation thin-film transistor T3 and the first initialization thin-film transistor T4 each have a dual gate electrode. But the embodiments are not limited thereto. The compensation thin-film transistor T3 and the first initialization thin-film transistor T4 may each have a single gate electrode.

Figure 5:
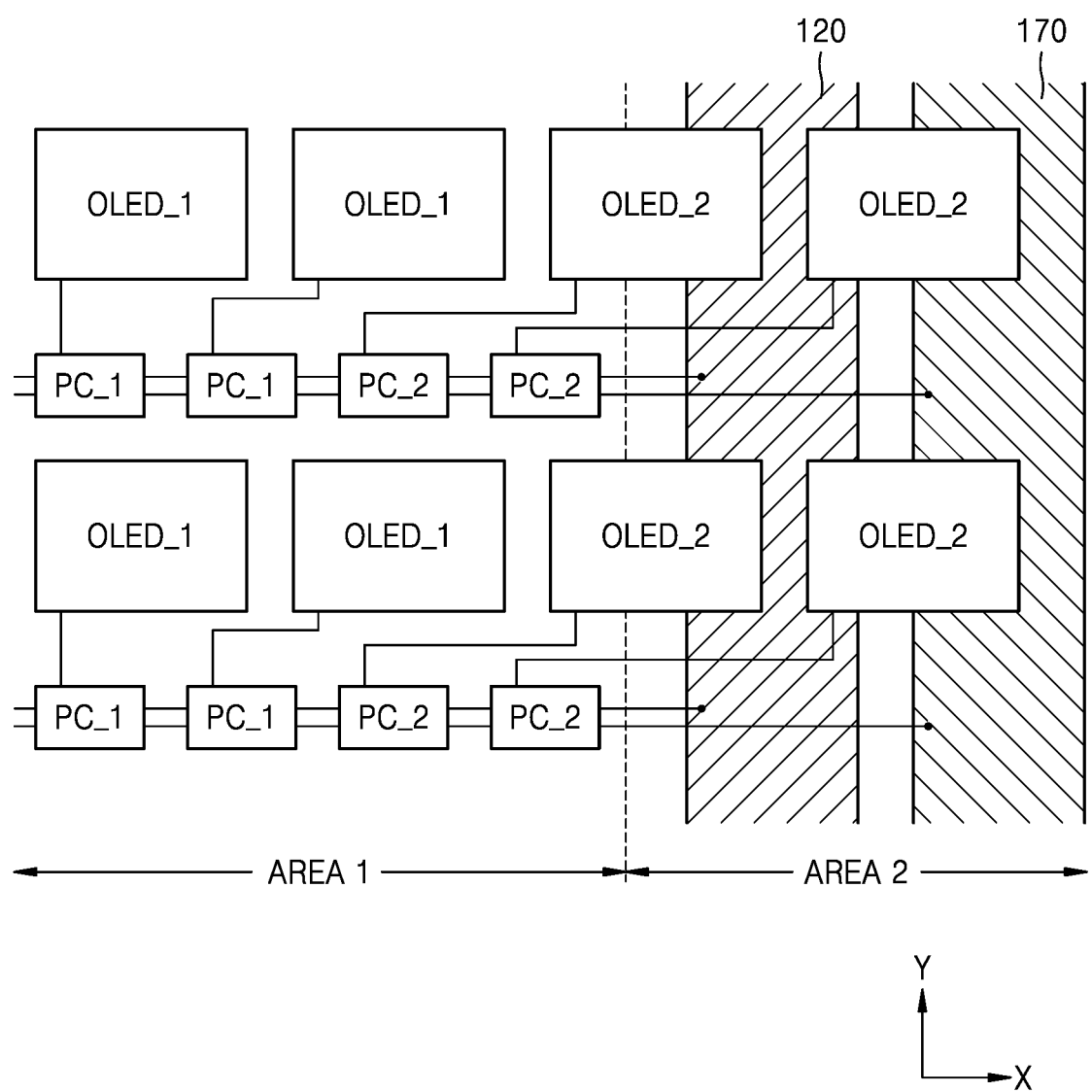
FIG. 5 is a schematic top-plan view of a layout structure of a pixel in a display device according to an embodiment.
Figure 6:
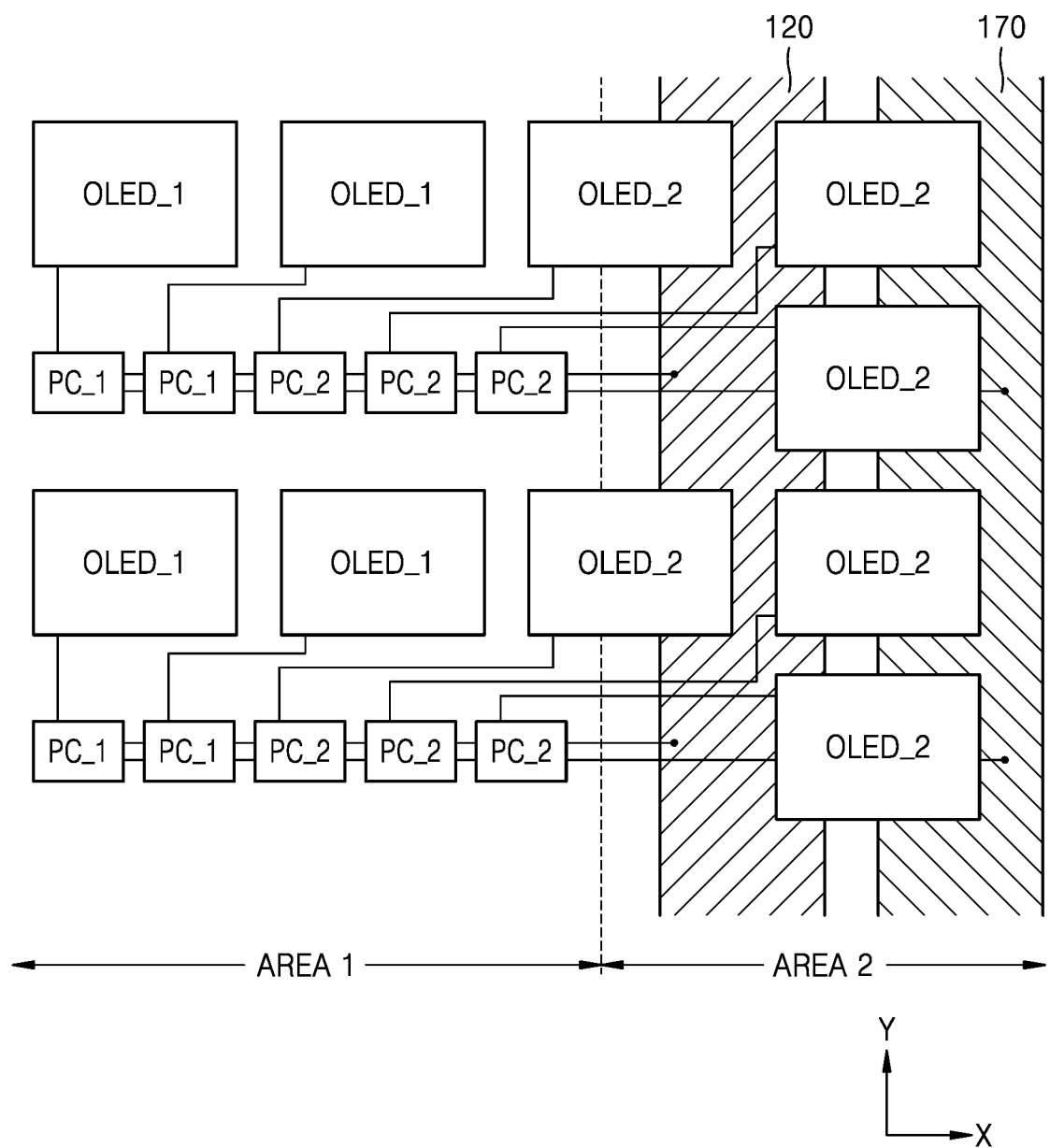
FIG. 6 is a schematic top-plan view of a layout structure of a pixel in a display device according to an embodiment.

FIGS. 5 and 6 are schematic top-plan views showing a layout structure of a pixel of the display device 1 according to various embodiments. For example, FIGS. 5 and 6 may be enlarged schematic top-plan views of a boundary portion between the first area AREA1 and the second area AREA2 at a right side of the display device 1 shown in FIG. 2.

The display device 1 may include pixel circuits including a first pixel circuit PC_1 and a second pixel circuit PC_2, and display elements including a first display element OLED_1 and a second display element OLED_2.

Each pixel circuit may be electrically connected to a display element to construct a pixel. For example, the first pixel circuit PC_1 may be electrically connected to the first display element OLED_1 to construct a first pixel, and the second pixel circuit PC_2 may be electrically connected to the second display element OLED_2 to construct a second pixel.

The first pixel circuits PC_1 and the second pixel circuits PC_2 may be arranged in the first area AREA1.

The first pixel circuits PC_1 and the second pixel circuits PC_2 may be arranged apart from one another at an interval in a direction (for example, the x direction).

The first pixel circuits PC_1 and the second pixel circuits PC_2 may be connected to the second scanning driving circuit 120 or the second power supply line 170 arranged in the second area AREA2, through a signal line or a voltage line, and may receive a signal or power from the second scanning driving circuit 120 or the second power supply line 170.

FIGS. 5 and 6 show that the second scanning driving circuit 120 and the second power supply line 170 are arranged in the second area AREA2. However, at least one of the first scanning driving circuit 110, the second scanning driving circuit 120, the terminal 140, the data driving circuit 150, the first power supply line 160, and the second power supply line 170 shown in FIG. 2 may be arranged in the second area AREA2.

The first display elements OLED_1 may be arranged in the first area AREA_1.

The first display elements OLED_1 may be electrically connected to the first pixel circuits PC_1 arranged in the first area AREA1.

The second display elements OLED_2 may be arranged in the second area AREA2. For example, the second display elements OLED_2 may be all arranged in the second area AREA2. In another example, some of the second display elements OLED_2 may be arranged at the boundary portion between the first area AREA1 and the second area AREA2.

The second display elements OLED_2 may be electrically connected to the pixel circuits PC_2 arranged in the first area AREA1. The second display element OLED_2 and the second pixel circuit PC_2, that construct one pixel, may be arranged apart from each other in the first area AREA1 and the second area AREA2, respectively.

In a display device in the related art, a display element and a pixel circuit may be arranged together in the first area AREA1 while no display element may be arranged in the second area. Accordingly, in the display device in the related art, the first area AREA1 may function as a display area that emits light and the second area AREA2 may function as a non-display area that does not emit light. In contrast, in an embodiment according to the disclosure, the second display element OLED_2 may be arranged in the second area AREA2 (which may correspond to the non-display area of the display device in the related art). Accordingly, not only the first area AREA1 but also the second area AREA2 may function as a display area. As another benefit of the second pixel circuit PC_2 providing an electrical signal related to driving to the second display element OLED_2 being arranged in the first area AREA1 (instead of the second area AREA2), the influence of the second pixel circuit PC_2 on the design of areas of various driving circuits or lines to be arranged in the second display area AREA2 may be reduced or eliminated.

According to various embodiments, the number of first pixel circuits PC_1 and second pixel circuits PC_2 arranged in the first area AREA1 may be greater than the number of first display elements OLED_1 arranged in the first area AREA1.

The number of first pixel circuits PC_1 and second pixel circuits PC_2 arranged in the first area AREA1 may correspond to the number of first display elements OLED_1 and second display elements OLED_2 arranged in the first area AREA1 and the second area AREA2. For example, in case that one pixel circuit may be connected to one display element, the number of first pixel circuits PC_1 and second pixel circuits PC_2 arranged in the first area AREA1 may be identical to the number of first display elements OLED_1 and second display elements OLED_2 arranged in the first area AREA1 and the second area AREA2.

A distance between the first pixel circuit PC_1 and the second pixel circuit PC_2 that adjoin each other may be less than a distance between the first display element OLED_1 and the second display element OLED_2 that adjoin each other. For example, in case that the number of first pixel circuits PC_1, second pixel circuits PC_2, first display elements OLED_1, and second display elements OLED_2 are identical to one another, the first pixel circuits PC_1 and the second pixel circuits PC_2 arranged only in the first area AREA1 may have to be arranged at a smaller interval than the first display elements OLED_1 and the second display elements OLED_2 that may be arranged in a distributed manner in the first area AREA1 and the second area AREA2. This will be described later with reference to FIGS. 7 and 8.

FIGS. 5 and 6 show that the first display element OLED_1 and the first pixel circuit PC_1 arranged in the first area AREA1 are arranged not to overlap each other in a plan view. However, in other embodiments, the first pixel circuit PC_1 and the first display element OLED_1 may be arranged to overlap each other. For example, the first display element OLED_1 may be arranged on the first pixel circuit PC_1 to overlap the first pixel circuit PC_1.

According to another embodiment, the second display element OLED_2 may be arranged in the another second area AREA2' (see FIG. 2). For example, the second area AREA2 shown in FIGS. 5 and 6 may be understood as the another second area AREA2' inside the first area AREA1 and surrounding the opening area OA (see FIG. 2). For example, in case that the second display element OLED_2 may be arranged in the another second area AREA2', the second display element OLED_2 may overlap lines located in the another second area AREA2'. For example, the second display element OLED_2 may overlap lines that are disconnected around the opening area OA or circumvent the opening area OA (see FIG. 2) (e.g., at least one of the scanning line SL, the emission control line EL, the data line DL, and the power voltage line PL).

Figure 7:
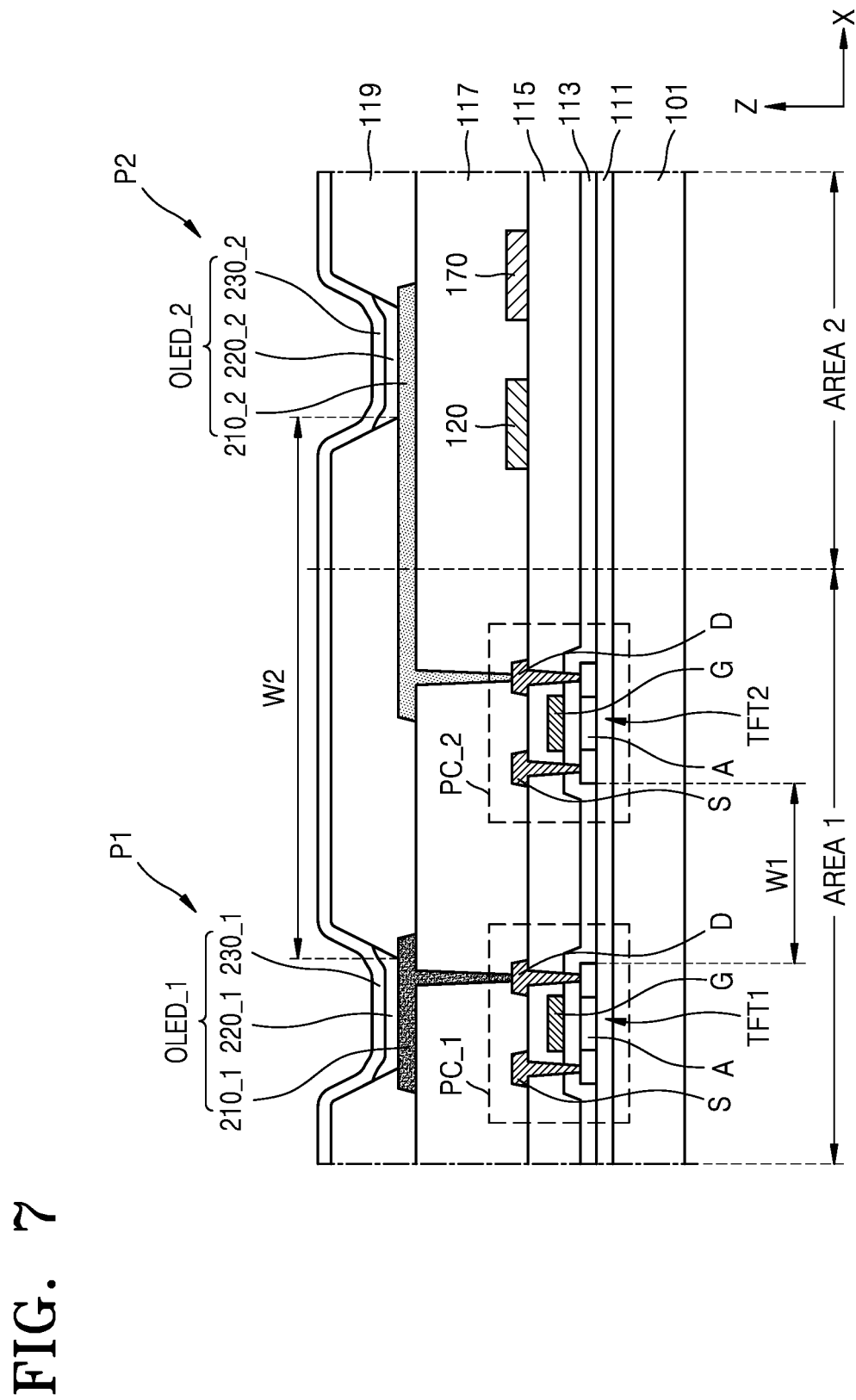
FIG. 7 is cross-sectional view of a part of a display device according to an embodiment.
Figure 8:
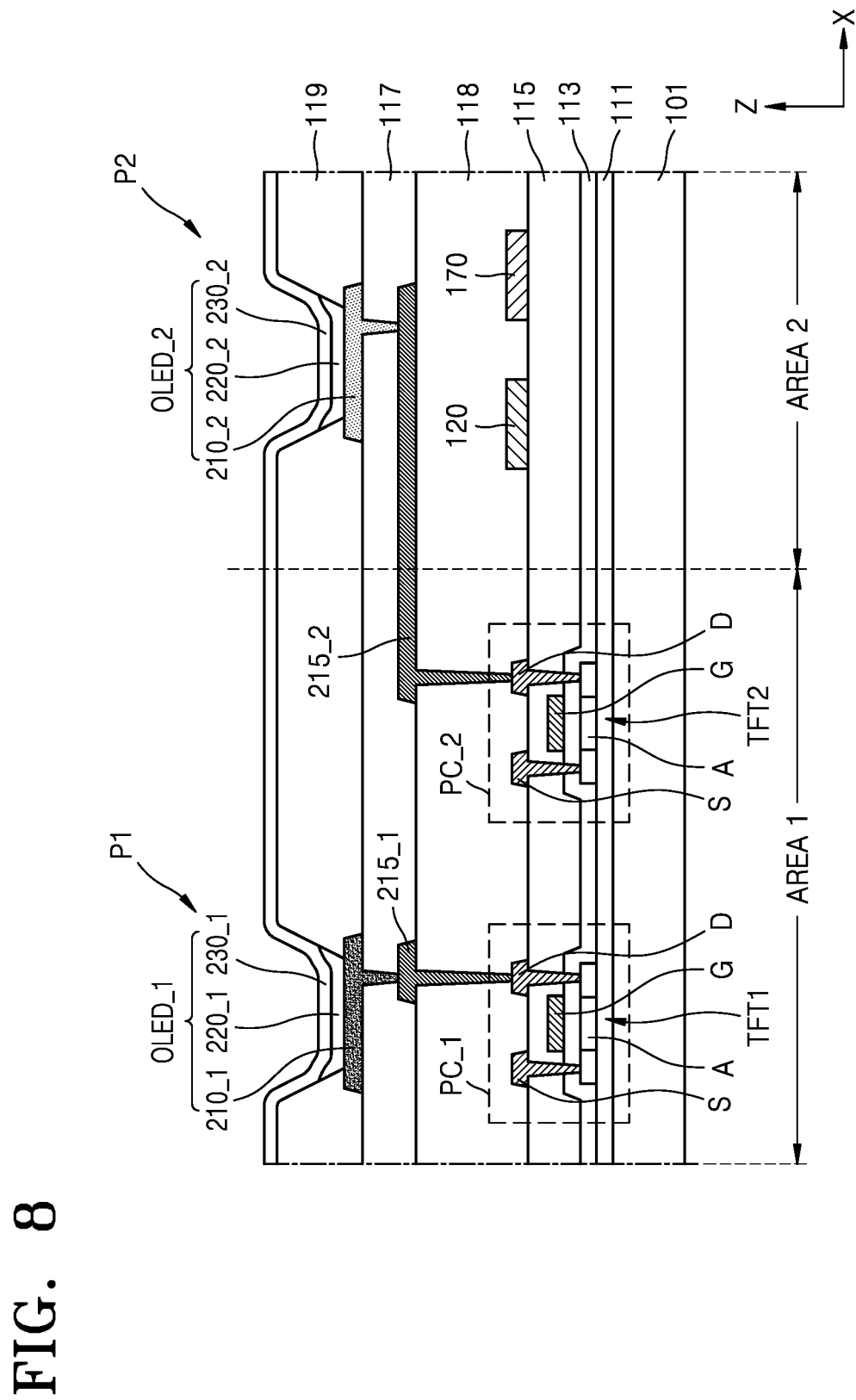
FIG. 8 is a cross-sectional view of a part of a display device according to an embodiment.

FIGS. 7 and 8 are each a schematic cross-sectional view of the display device 1 according to an embodiment.

Referring to FIGS. 7 and 8, multiple pixels including a first pixel P1 and a second pixel P2 may be arranged on a substrate 101.

The first pixel P1 may include the first pixel circuit PC_1, which may include a first driving thin-film transistor TFT1, and the first display element OLED_1. A first pixel electrode 210_1 of the first display element OLED_1 arranged in the first area AREA1 may be electrically connected to the first driving thin-film transistor TFT1 arranged in the first area AREA1.

The second pixel P2 may include the second pixel circuit PC_2, which may include a second driving thin-film transistor TFT2, and the second display element OLED_2. A second pixel electrode 210_2 of the second display element OLED_2 arranged in the second area AREA2 may be electrically connected to a second driving thin-film transistor TFT2 arranged in the first area AREA1.

The substrate 101 may include glass or a polymer resin. The polymer resin may include polyethersulfone, polyarylate, polyetherimide, polyethylene naphthalate, polyethylene terephthalate, polyphenylene sulfide, polyarylate, polyimide, polycarbonate, cellulose acetate propionate, or a combination thereof. The substrate 101 including the polymer resin may be, for example, flexible, rollable, or bendable. The substrate 101 may include a multi-layer structure including a layer, which includes the above-described polymer resin, and an inorganic layer.

The first driving thin-film transistor TFT1 and the second driving thin-film transistor TFT2 may include a semiconductor layer A, which may include amorphous silicon, polycrystalline silicon, an organic semiconductor material or a combination thereof, a gate electrode G, a source electrode S, and a drain electrode D.

The semiconductor layer A may be above the substrate 101, and a buffer layer 111 may be arranged under the first driving thin-film transistor TFT1 and the second driving thin-film transistor TFT2. The buffer layer 111 may include an inorganic material such as silicon oxide, silicon nitride, silicon oxynitride, or a combination thereof. The buffer layer 111 may prevent impurities from permeating into the substrate 101.

The semiconductor layer A may include amorphous silicon. As another embodiment, the semiconductor layer A may include an oxide semiconductor including indium (In), gallium (Ga), stannum (Sn), zirconium (Zr), vanadium (V), hafnium (Hf), cadmium (Cd), germanium (Ge), chromium (Cr), titanium (Ti), zinc (Zn), or a combination thereof. For example, the semiconductor layer A may include an oxide semiconductor such as indium gallium zinc oxide (IGZO), zinc tin oxide (ZTO), zinc indium oxide (ZIO), or a combination thereof.

The gate electrode G may be arranged above the semiconductor layer A with a gate insulating layer 113 therebetween. The gate electrode G may include molybdenum (Mo), aluminum (Al), copper (Cu), titanium (Ti), or a combination thereof, and may include a single layer or multi-layer structure. For example, the gate electrode G may be a single Mo layer.

The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof.

The source electrode S and/or the drain electrode D may be arranged above the gate electrode G with an interlayer insulating layer 115 therebetween. The source electrode S and/or the drain electrode D may include Mo, Al, Cu, Ti, or a combination thereof, and may include a single layer or multi-layer structure. For example, the source electrode S and/or drain electrode D may include a Ti/Al/Ti multi-layer structure.

A planarization layer 117 may cover an upper surface of the source electrode S and/or drain electrode D and have an even upper surface such that the first pixel electrode 210_1 and the second pixel electrode 210_2 may be formed of an even measure. The planarization layer 117 may include a single layer or multi-layer structure including a film that may include an organic material. The planarization layer 117 may include a general commercial polymer like benzocyclobutene (BCB), polyimide, hexamethyldisiloxane (HMDSO), polymethylmethacrylate, polystyrene, or a combination thereof, a polymer derivative having a phenolic group, an acryl-based polymer, an imide-based polymer, an aryl ether-based polymer, an amide-based polymer, a fluoride-based polymer, a p-xylene-based polymer, a vinyl alcohol-based polymer, or a combination thereof. The planarization layer 117 may include an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), or a combination thereof. In case that the planarization layer 117 includes an inorganic material, chemical planarization polishing may be performed in some embodiments. The planarization layer 117 may include both an organic material and an inorganic material.

The first pixel electrode 210_1 and the second pixel electrode 210_2 may be transmissive electrodes, semi-transmissive electrodes, or reflective electrodes. In some embodiments, the first pixel electrode 210_1 and the second pixel electrode 210_2 may each include a reflective film including Ag, Mg, Al, Pt, Pd, Au, Ni, Nd, Ir, Cr, a compound thereof, and a transparent electrode layer or semitransparent electrode layer formed on the reflective film. The transparent electrode layer or semitransparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first pixel electrode 210_1 and the second pixel electrode 210_2 may include an ITO/Ag/ITO stack structure.

A pixel defining layer 119 may be arranged on the planarization layer 117. The pixel defining layer 119 may define an emission area of each pixel by having an opening corresponding to center portions of the first pixel electrode 210_1 and the second pixel electrode 210_2. The pixel defining layer 119 may increase distances between edges of the first pixel electrode 210_1 and the second pixel electrode 210_2 and opposite electrodes 230_1 and 230_2 above the first pixel electrode 210_1 and the second pixel electrode 210_2, thereby preventing an arc from occurring at the edges of the first pixel electrode 210_1 and the second pixel electrode 210_2. The pixel defining layer 119 may be formed of an organic insulating material such as polyimide, polyamide, an acryl resin, benzocyclobutene, hexamethyldisiloxane (HMDSO), a phenol resin, or a combination thereof. The pixel defining layer 119 may be formed, for example, in a method such as a spin coating method.

A first intermediate layer 220_1 and a second intermediate layer 220_2 in the first display element OLED_1 and the second display element OLED_2 may each include an organic emission layer. The organic emission layer may include an organic material that includes a fluorescent or phosphorescent material emitting red, green, blue, or white light. The organic emission layer may include a low molecular weight organic material or a high molecular weight organic material. A functional layer such as a hole transport layer (HTL), a hole injection layer (HIL), an electron transport layer (ETL), an electron injection layer (EIL), and the like may be selectively arranged under and/or above the organic emission layer. The first intermediate layer 220_1 and the second intermediate layer 220_2 may be arranged to correspond to the first pixel electrode 210_1 and the second pixel electrode 210_2, respectively.

The first opposite electrode 230_1 and the second opposite electrode 230_2 may be a transmissive electrode or a reflective electrode. In some embodiments, the first opposite electrode 230_1 and the second opposite electrode 230_2 may be transparent or semitransparent electrodes and include a metal thin-film that has a small work function, the metal thin-film including Li, Ca, LiF/Ca, LiF/Al, Al, Ag, Mg, and a compound thereof. A transparent conductive oxide (TCO) layer such as ITO, IZO, ZnO, or $In_2O_3$ may be further arranged on the metal thin-film. The first opposite electrode 230_1 and the second opposite electrode 230_2 may be arranged over the first area AREA1 and the second area AREA2 and arranged on the first intermediate layer 220_1, the second intermediate layer 220_2 and the pixel defining layer 119.

According to an embodiment, as shown in FIG. 7, the second pixel circuit PC_2 may be arranged in the first area AREA1 and the second display element OLED_2 may be arranged in the second area AREA2. The second pixel circuit PC_2 and the second display element OLED_2 may be connected to each other via the second pixel electrode 210_2 that extends from the first area AREA1 to the second area AREA2. For example, the second pixel electrode 210_2 may extend from a portion of the second area AREA2, in which the second display element OLED_2 may be arranged, to a portion of the first area AREA1, in which the second pixel circuit PC_2 may be arranged, and be connected to the second driving thin-film transistor TFT2 in the second pixel circuit PC_2.

The second display element OLED_2 may be arranged not to overlap the second pixel circuit PC_2. The second display element OLED_2 may overlap the second scanning driving circuit 120 and/or the second power supply line 170 in the second area AREA2. FIGS. 7 and 8 show the second scanning driving circuit 120 and the second power supply line 170 arranged to overlap the second display element OLED_2. However, according to positions of components arranged in the second area AREA2, the second display element OLED_2 may be arranged to overlap at least one of the first scanning driving circuit 110, the second scanning driving circuit 120, the terminal 140, the first power supply line 160, or the second power supply line 170.

The second display element OLED_2 may be arranged in the second area AREA2 without overlapping the second pixel electrode PC_2 arranged in the first area AREA1. Therefore, a distance between the first pixel circuit PC_1 and the second pixel circuit PC_2 may be less than a distance between the first display element OLED_1 and the second display element OLED_2.

For example, a first distance W1 from an end of the semiconductor layer A of the first driving thin-film transistor TFT1 constructing the first pixel circuit PC_1 to an end of the semiconductor layer A of the second driving thin-film transistor TFT2 constructing the second pixel circuit PC_2 may be less than a second distance W2 from an end of an opening that exposes a center portion of the first pixel electrode 210_1 formed in the pixel defining layer 119 to an end of an opening that exposes a center portion of the second pixel electrode 210_2.

According to another embodiment, as shown in FIG. 8, the second pixel circuit PC_2 in the first area AREA1 and the second display element OLED_2 in the second area AREA2 may be connected to each other via a second contact metal layer 215_2 extending from the first area AREA1 to the second area AREA2.

For example, the display device 1 may further include an organic insulating layer 118 between the interlayer insulating layer 115 and the planarization layer 117. The organic insulating layer 118 may include an organic insulating layer such as a general commercial polymer like polymethylmethacrylate (PMMA) or polystyrene (PS), a polymer derivative having a phenolic group, an acryl-based polymer, an imide-based polymer, an aryl ether-based polymer, an amide-based polymer, a fluoride-based polymer, a p-xylene-based polymer, a vinyl alcohol-based polymer, and a blend thereof.

A first contact metal layer 215_1 that electrically connects the first thin-film transistor TFT1 to the first pixel electrode 210_1 and the second contact metal layer 215_2 that electrically connects the second thin-film transistor TFT2 to the second pixel electrode 210_2 may be arranged on the organic insulating layer 118.

The first contact metal layer 215_1 and the second contact metal layer 215_2 may include a conductive material including Mo, Al, Cu, Ti, or a combination thereof. The first contact metal layer 215_1 and the second contact metal layer 215_2 may have a multi-layer or single layer structure including the materials stated above. The first contact metal layer 215_1 and the second contact metal layer 215_2 may be each formed into a multi-layer structure in which a titanium layer, an aluminum layer, and a titanium layer are sequentially stacked. Portions of the first contact metal layer 215_1 and the second contact metal layer 215_2 may be covered by the organic insulating layer 118.

The organic insulating layer 118 may be arranged under the planarization layer 117. The first pixel electrode 210_1 and the second pixel electrode 210_2 may be respectively connected to the first contact metal layer 215_1 and the second contact metal layer 215_2 via contact holes defined in the organic insulating layer 118 and the planarization layer 117.

Figure 9:
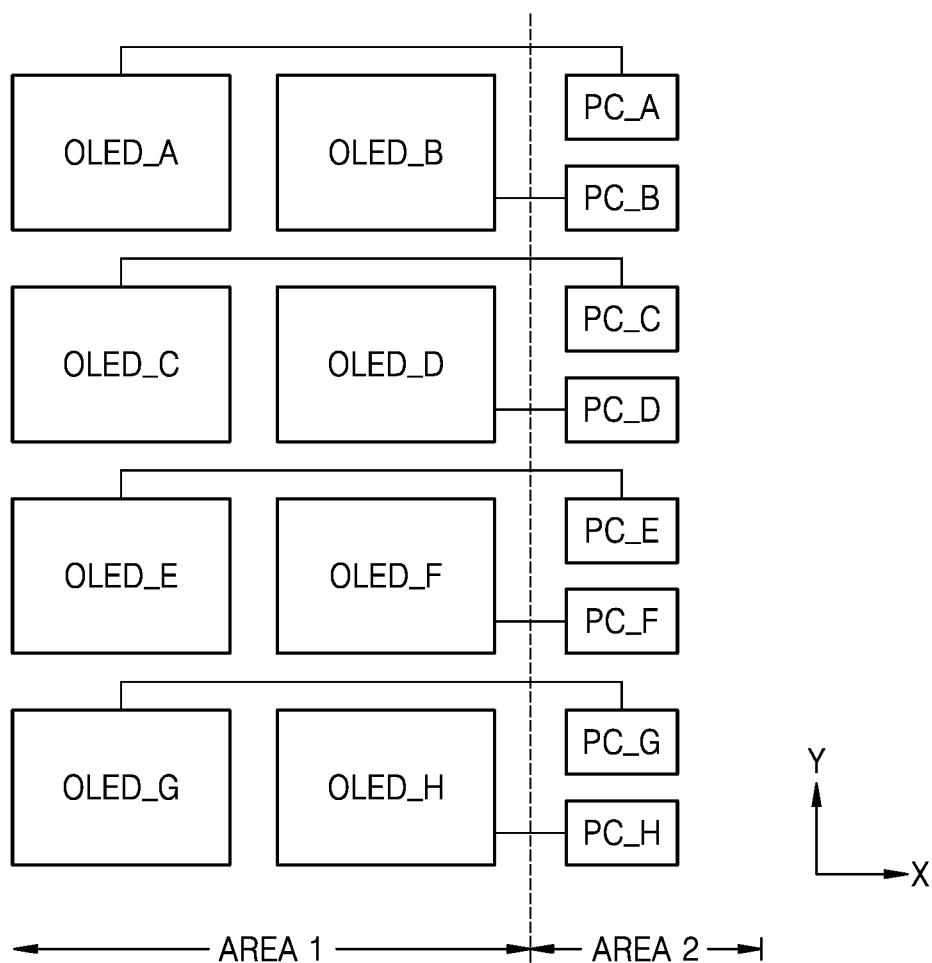
FIG. 9 is a top-plan view of a layout structure of pixels in a display device according to an embodiment.

FIG. 9 is a top-plan view of a layout structure of pixels in the display device 1 according to an embodiment.

Referring to FIG. 9, the display device 1 may include a first area AREA1 and a second area AREA2 adjacent to the first area AREA1. In the embodiment of FIG. 9, the first area AREA1 may be a bendable area in the display device 1 and the second area AREA2 may be a non-bendable area. For example, the first area AREA1 may correspond to a bending area BA of a rollable or bendable display device shown in FIG. 12D and the second area AREA2 may correspond to a non-bending area NBA of the display device.

Pixel circuits PC_A through PC_H may be arranged in the second area AREA2, and display elements OLED_A through OLED_H respectively corresponding to the pixel circuits PC_A through PC_H may be arranged in the first area AREA1. The first area AREA1 in which the display elements OLED_A through OLED_H may be arranged may function as a display area.

Although it is not shown, components for providing a signal and/or power (for example, driving circuits and connection lines) to each pixel circuit may be further arranged in the first area AREA1.

According to embodiments, as the display elements OLED_A through OLED_H and the pixel circuits PC_A through PC_H are respectively arranged in different areas, damage caused by bending in the first area AREA1 in which the display elements OLED_A through OLED_H are arranged may be minimized. For example, the display device 1 according to embodiments may have a smaller thickness than a display device, in which a display element and a pixel circuit are arranged to overlap each other in the bending area, and may have relatively excellent bending characteristics.

Each of the display elements OLED_A through OLED_H may be connected to any one of the pixel circuits PC_A through PC_H to construct a pixel. Accordingly, the number of display elements OLED_A through OLED_H arranged in the first area AREA1 may correspond to the number of pixel circuits PC_A through PC_H arranged in the second area AREA2. For example, the number of display elements OLED_A through OLED_H arranged in the first area AREA1 may be identical to the number of pixel circuits PC_A through PC_H arranged in the second area AREA2.

An area of the first area AREA1 in which the display elements OLED_A through OLED_H are arranged may be respectively greater than an area of the second area AREA2 in which the pixel circuits PC_A through PC_H are arranged. For example, the number of pixel circuits PC_A through PC_H per unit area may be greater than the number of display elements OLED_A through OLED_H per unit area.

Figure 10:
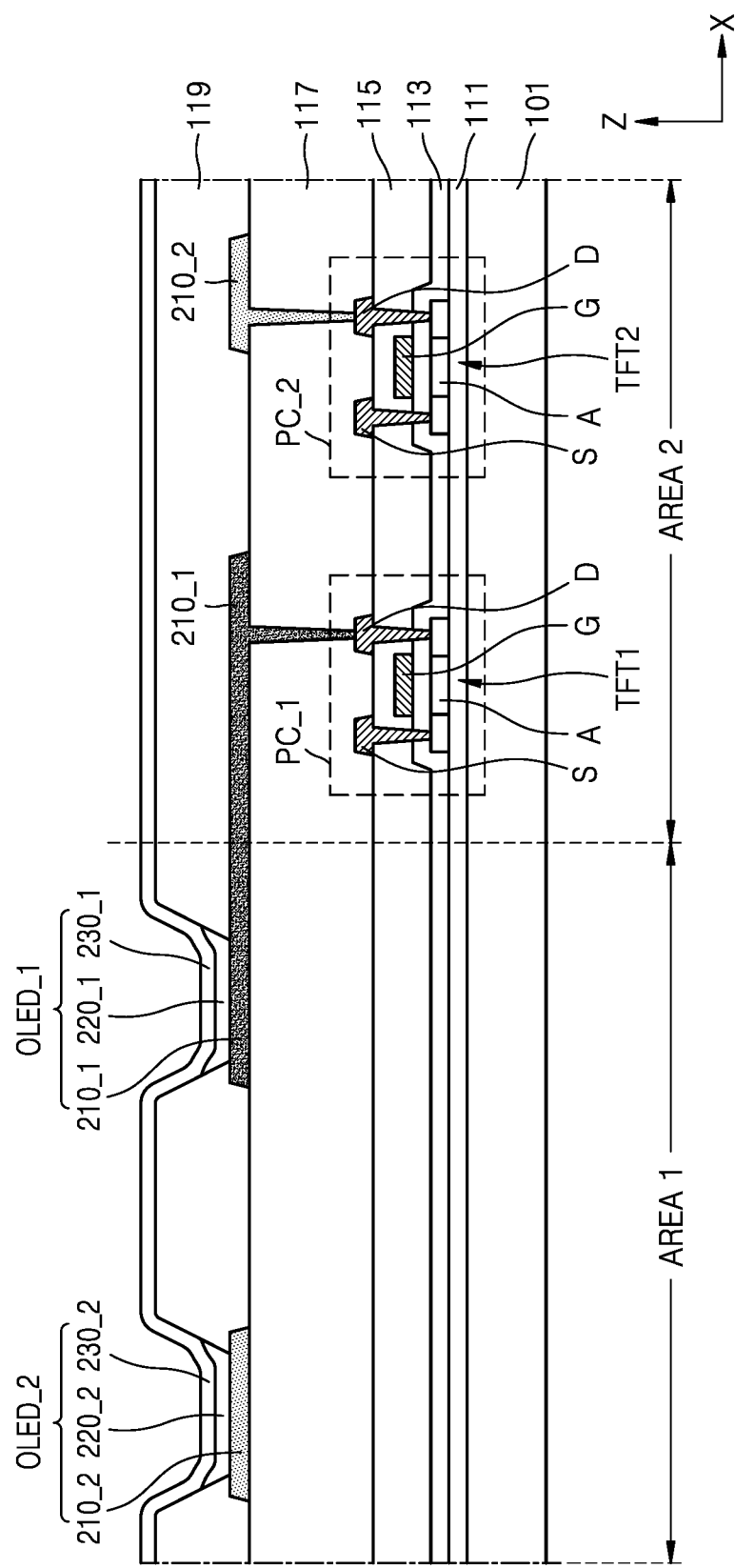
FIG. 10 is a cross-sectional view of a part of a display device according to an embodiment.
Figure 11:
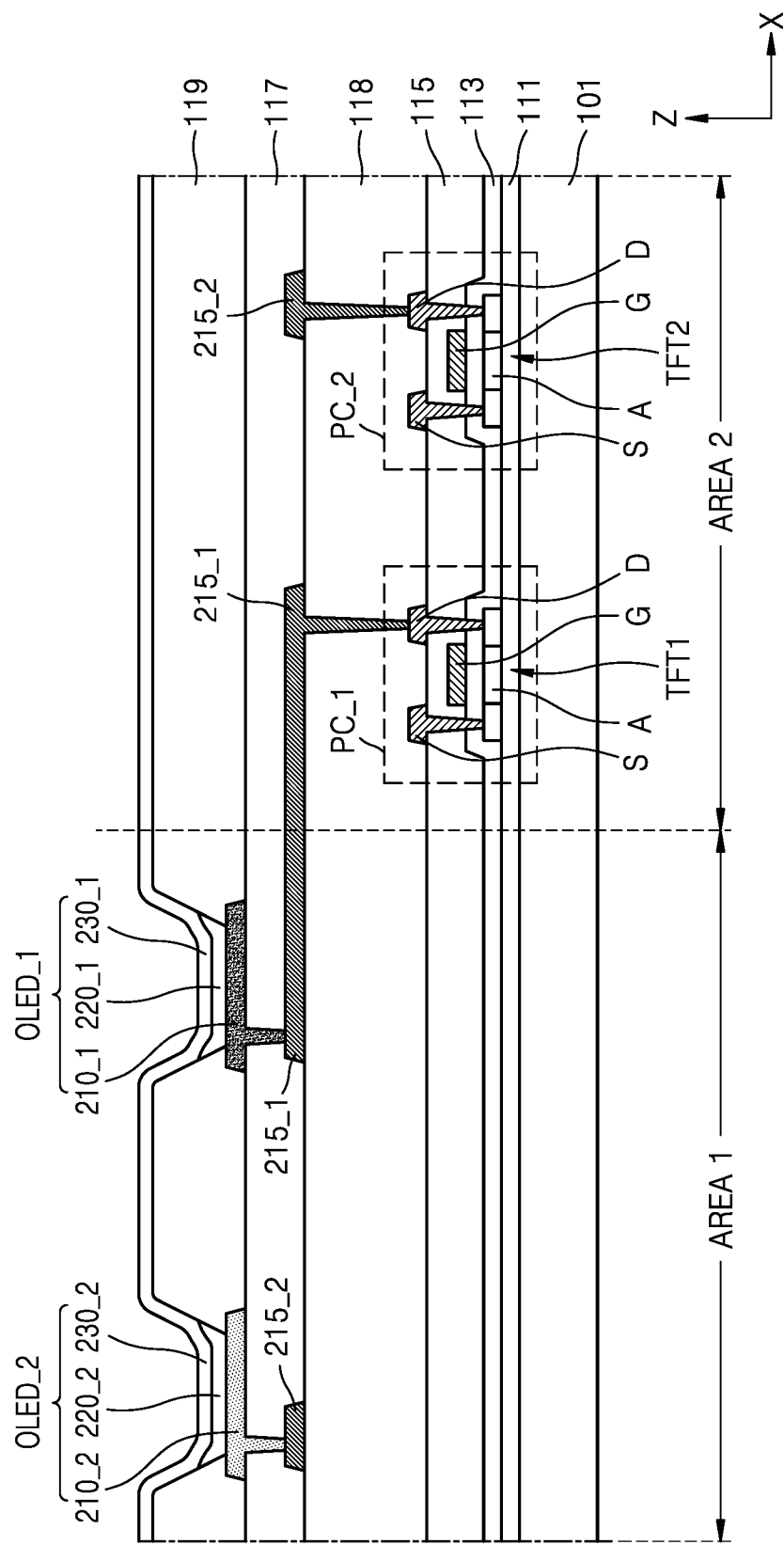
FIG. 11 is a cross-sectional view of a part of a display device according to an embodiment.

FIG. 10 and FIG. 11 are cross-sectional views showing a portion of the display device 1 according to an embodiment.

Referring to FIGS. 10 and 11, the first pixel circuits PC_1 and the second pixel circuits PC_2 arranged in the second area AREA2 and the first display elements OLED_1 and the second display elements OLED_2 arranged in the first area AREA1 may each be connected by any one of the first pixel electrode 210_1 and the second pixel electrode 210_2 or the first contact metal layer 215_1 and the second contact metal layer 215_2.

For example, as shown in FIG. 10, the first pixel electrode 210_1 may extend from an area of the second area AREA2, in which the first pixel circuit PC_1 may be arranged, to an area of the first area AREA1, in which the first display element OLED_1 may be arranged, thereby connecting the first pixel circuit PC_1 and the first display element OLED_1. On the other hand, although it is not shown in FIG. 10, the second pixel electrode 210_2 may extend from an area of the second area AREA2, in which the second pixel circuit PC_2 may be arranged, to an area of the first area AREA1, in which the second display element OLED_2 may be arranged, thereby connecting the second pixel circuit PC_2 and the second display element OLED_2.

In another example, as shown in FIG. 11, the first contact metal layer 215_1 may extend from the area of the second area AREA2, in which the first pixel circuit PC_1 may be arranged, to the area of the first area AREA1, in which the first display element OLED_1 may be arranged, thereby connecting the first pixel circuit PC_1 and the first display element OLED_1. On the other hand, although it is not shown in FIG. 11, the second contact metal layer 215_2 may extend from the area of the second area AREA2, in which the second pixel circuit PC_2 may be arranged, to the area of the first area AREA1, in which the second display element OLED_2 may be arranged, thereby connecting the second pixel circuit PC_2 and the second display element OLED_2.

According to another embodiment, the first pixel circuit PC_1 and the first display element OLED_1 may be connected to each other via the first pixel electrode 210_1, and the second pixel circuit PC_2 and the second display element OLED_2 may be connected to each other via the second contact metal layer 215_2.

In an embodiment, the number of a display pixel circuits per unit area may be greater than a number of display elements per unit area. In another embodiment, the number of display elements arranged in the first area may correspond to the number of pixel circuits arranged in the second area.

Figure 12A:
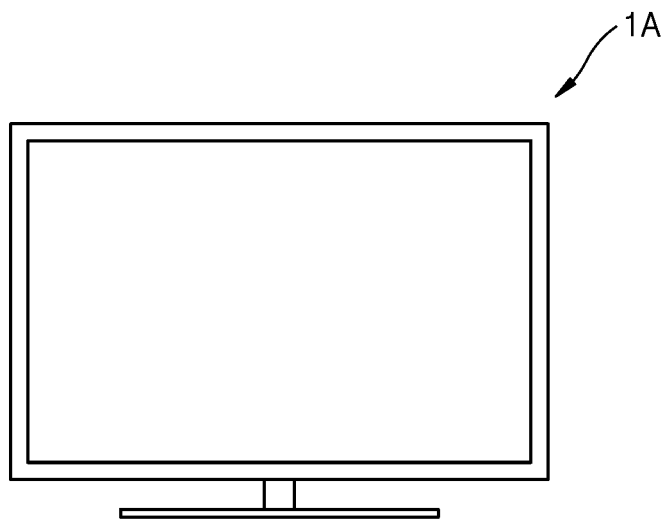
FIGS. 12A through 12D are each a schematic diagram of a display device according to an embodiment.
Figure 12B:
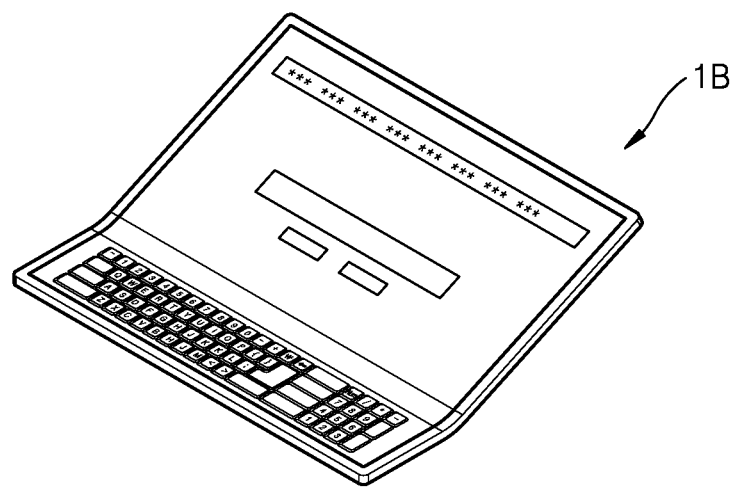
Figure 12C:
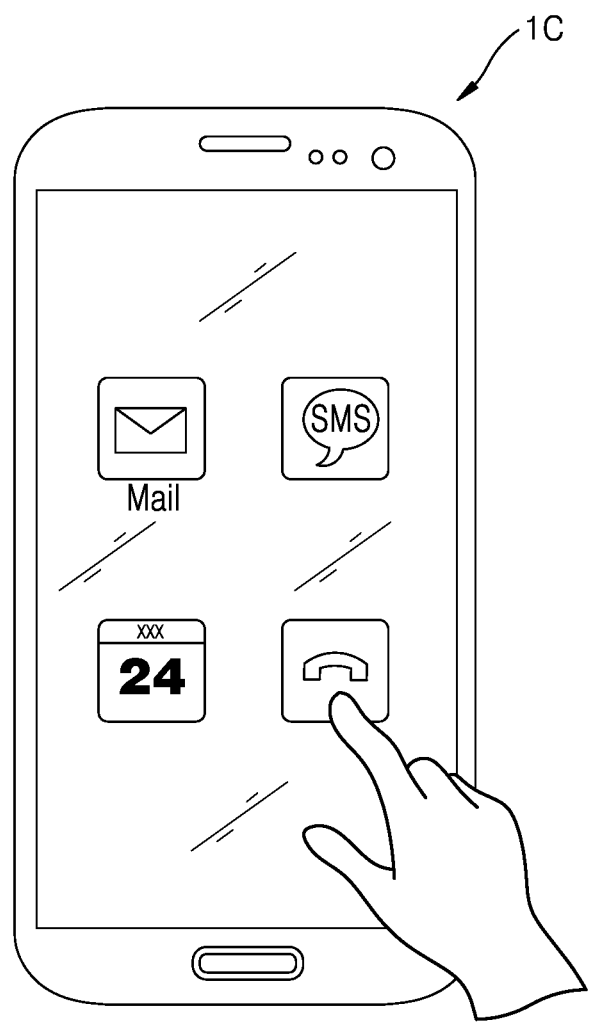
Figure 12D:
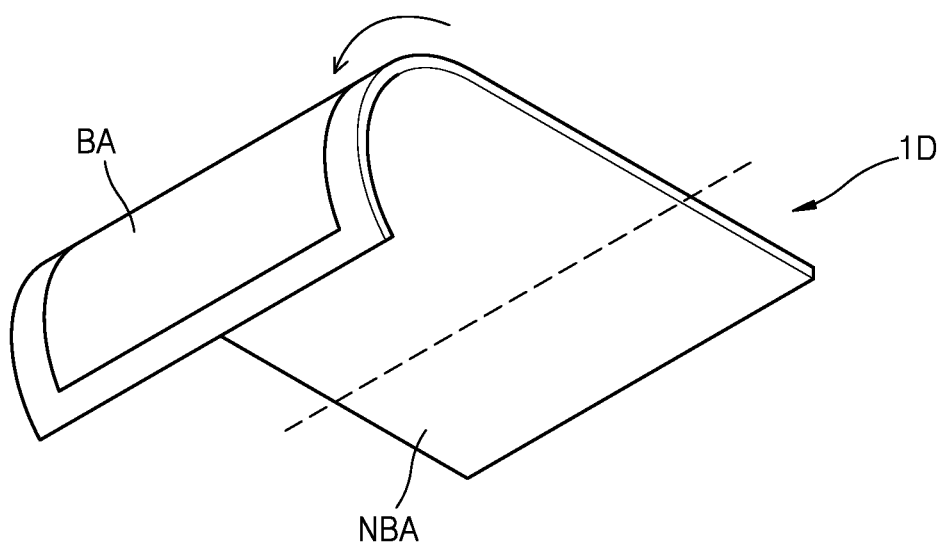

The display device 1 including the above-stated structure may be a television 1A as shown in FIG. 12A, a laptop computer or a foldable tablet PC 1B as shown in FIG. 12B, a portable display 1C such as a mobile phone as shown in FIG. 12C, or a flexible display device 1D that may be rollable or bendable as shown in FIG. 12D. In another example, the display device 1 may also be applied to a display portion provided in an artificial intelligence speaker. As such, a structure according to embodiments may be not limited to a particular electronic device as long as the electronic device may be capable of providing an image.

According to various embodiments, there may be provided a display device in which an area of an area capable of outputting an image may be maximized to thereby improve aesthetic impression and user convenience. There may be provided a display device that may be easily bent in the area of outputting the image as the display elements and pixel circuits of the pixels are arranged in different areas.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate comprising a first area and a second area adjacent to the first area;
pixel circuits disposed on the substrate, and the pixel circuits comprising a first pixel circuit disposed in the first area and a second pixel circuit disposed in the first area; and
display elements disposed on the substrate, the display elements comprising:
a first display element disposed in the first area and electrically connected to the first pixel circuit, wherein the first pixel circuit and the display element are disposed to overlap each other on the substrate; and
a second display element disposed in the second area and electrically connected to the second pixel circuit, wherein the second display element is configured not to overlap the second pixel circuit.

2. The display device of claim 1, wherein the display elements each comprise:
a pixel electrode;
an opposite electrode disposed on the pixel electrode; and
an intermediate layer between the pixel electrode and the opposite electrode, wherein
the pixel electrode of the second display element extends from the second area to the first area and is electrically connected to the second pixel circuit in the first area.

3. The display device of claim 2, wherein the pixel circuits each comprise a thin-film transistor comprising:
a semiconductor layer;
a gate electrode overlapping the semiconductor layer; and
an electrode layer connected to the semiconductor layer, wherein
the pixel electrode of the second display element is electrically connected to the electrode layer of the second pixel circuit.

4. The display device of claim 1, further comprising:
a contact metal layer between the pixel circuits and the display elements,
wherein the contact metal layer extends from the first area to the second area and electrically connects the second pixel circuit disposed in the first area to the second display element disposed in the second area.

5. The display device of claim 1, wherein a distance between the first pixel circuit and the second pixel circuit is less than a distance between the first display element and the second display element.

6. The display device of claim 1, wherein a number of the pixel circuits disposed in the first area is greater than a number of the display elements disposed in the first area.

7. The display device of claim 1, wherein a number of the pixel circuits disposed in the first area corresponds to a number of the display elements disposed in the first area and the second area.

8. The display device of claim 1, wherein a number of the pixel circuits per unit area is greater than a number of the display elements per unit area.

9. The display device of claim 1, wherein the second display element is disposed to overlap at least one of a driving circuit and a connection line which are disposed on the substrate in the second area.

10. A display device comprising:
a substrate comprising:
   a first area;
   a second area adjacent to the first area; and
   an opening area surrounded by the second area;
pixel circuits disposed on the substrate and comprising:
   a first pixel circuit disposed in the first area; and
   a second pixel circuit disposed in the first area; and
display elements disposed on the substrate, the display elements comprising;
   a first display element electrically connected to the first pixel circuit and disposed in the first area, wherein the first pixel circuit and the first display element are disposed to overlap each other on the substrate; and
   a second display element electrically connected to the second pixel circuit and disposed in the second area, wherein the second display element is configured not to overlap the second pixel circuit.

11. The display device of claim 10, wherein the second display element is electrically connected to the second pixel circuit via one of:
   a pixel electrode included in the second display element and extending from the second area to the first area; and
   a contact metal layer between the pixel circuits and the display elements and extending from the first area to the second area.

12. The display device of claim 10, wherein a distance between the first pixel circuit and the second pixel circuit is less than a distance between the first display element and the second display element.

13. A display device comprising:
a substrate comprising a first area and a second area adjacent to the first area;
pixel circuits disposed on the substrate, and the pixel circuits comprising a first pixel circuit disposed in the first area and a second pixel circuit disposed in the first area;
a scan driving circuit disposed in the second area and providing a scanning signal to the first pixel circuit and the second pixel circuit through a scanning line;
display elements disposed on the substrate, the display elements comprising:
   a first display element disposed in the first area and electrically connected to the first pixel circuit, wherein the first pixel circuit and the first display element are disposed to overlap each other on the substrate; and
   a second display element disposed in the second area and electrically connected to the second pixel circuit, wherein the second display element is disposed to overlap at least one of the scan driving circuit and the power supply line; and
a power supply line disposed in the second area and providing a power voltage to an opposite electrode of the first display element and the second display element.

* * * * *